US007364924B2

(12) United States Patent
Hsu et al.

(10) Patent No.: US 7,364,924 B2
(45) **Date of Patent: *Apr. 29, 2008**

(54) SILICON PHOSPHOR ELECTROLUMINESCENCE DEVICE WITH NANOTIP ELECTRODE

(75) Inventors: Sheng Teng Hsu, Camas, WA (US); Fengyan Zhang, Vancouver, WA (US); Gregory M. Stecker, Vancouver, WA (US); Robert A. Barrowcliff, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 352 days.

This patent is subject to a terminal disclaimer.

(21) Appl. No.: 11/061,946

(22) Filed: Feb. 17, 2005

(65) Prior Publication Data

US 2006/0180817 A1 Aug. 17, 2006

(51) Int. Cl.
*H01L 21/00* (2006.01)

(52) U.S. Cl. ........................ 438/20; 438/634; 438/636; 257/E21.453

(58) Field of Classification Search .................. 438/20, 438/634, 636; 257/E21.453
See application file for complete search history.

(56) References Cited

U.S. PATENT DOCUMENTS 6,517,740 B2 * 2/2003 Kataoka et al. ....... 252/301.4 F
7,202,596 B2 * 4/2007 Tang et al. ................ 313/495

OTHER PUBLICATIONS

J. Ruan et al APL vol. 83, #26, Dec. 26, 2003 p. 1-3.
A. Polman, J. Appl. Phys. 82 (1), Jul. 1, 1997 p. 1-39.
R. Chen et al, APL vol. 84, #9, 2004, p. 1552-1554.

* cited by examiner

*Primary Examiner*—Lynne Gurley
*Assistant Examiner*—Samuel A Gebremariam
(74) *Attorney, Agent, or Firm*—Law Office of Gerald Maliszewski; Gerald Maliszewski

(57) ABSTRACT

An electroluminescence (EL) device and a method are provided for fabricating said device with a nanotip electrode. The method comprises: forming a bottom electrode with nanotips; forming a Si phosphor layer adjacent the nanotips; and, forming a transparent top electrode. The Si phosphor layer is interposed between the bottom and top electrodes. The nanotips may have a tip base size of about 50 nanometers, or less, a tip height in the range of 5 to 50 nm, and a nanotip density of greater than 100 nanotips per square micrometer. Typically, the nanotips are formed from iridium oxide (IrOx) nanotips. A MOCVD process forms the Ir bottom electrode. The IrOx nanotips are grown from the Ir. In one aspect, the Si phosphor layer is a SRSO layer. In response to an SRSO annealing step, nanocrystalline SRSO is formed with nanocrystals having a size in the range of 1 to 10 nm.

16 Claims, 6 Drawing Sheets

TO Fig. 11B

SILICON PHOSPHOR ELECTROLUMINESCENCE DEVICE WITH NANOTIP ELECTRODE

BACKGROUND OF THE INVENTION

1. Field of the Invention

This invention generally relates to integrated circuit (IC) fabrication and, more particularly, to an electroluminescence device made using a silicon phosphor and an electrode with nanotips.

2. Description of the Related Art

The generation of light from semiconductor devices is possible, regardless of whether the semiconductor material forms a direct or indirect bandgap. High field reverse biased p-n junctions create large hot carrier populations that recombine with the release of photons. For silicon devices, the light generation efficiency is known to be poor and the photon energy is predominantly around 2 eV. The conversion of electrical energy to optical photonic energy is called electroluminescence (EL). Efficient EL devices have been made that can operate with small electrical signals, at room temperature. However, these devices are fabricated on materials that are typically not compatible with silicon, for example type III-V materials such as InGaN, AlGaAs, GaAsP, GaN, and GaP. An EL device built on one of these substrates can efficiently emit light in a narrow bandwidth within the visible region, depending on the specific material used. Additionally, type II-VI materials such as ZnSe have been used. Other type II-VI materials such as ZnS and ZnO are known to exhibit electroluminescence under ac bias conditions. These devices can be deposited onto silicon for use in light generating devices if special (non-conventional) CMOS processes are performed. Other classes of light emitting devices are organic light emitting diodes (OLEDs), nanocrystalline silicon (nc-Si), and polymer LEDs.

A simple and efficient light-emitting device compatible with silicon, and powered by a dc voltage would be desirable in applications where photonic devices (light emitting and light detecting) are necessary. Efficient silicon substrate EL devices would enable a faster and more reliable means of signal coupling, as compared with conventional metallization processes. Further, for intra-chip connections on large system-on-chip type of devices, the routing of signals by optical means is also desirable. For inter-chip communications, waveguides or direct optical coupling between separate silicon pieces would enable packaging without electrical contacts between chips. For miniature displays, a method for generating small point sources of visible light would enable simple, inexpensive displays to be formed.

J. Ruan et al. have proposed a structure of nano silicon superlattice light emission devices, formed from a multilevel of nano-silicon/oxide layers. The radiation center is the Si═O bonds. However, voltage pulses with high alternative polarities are required to generate electron-hole pairs.

Polman et al. have proposed doping silicon-based materials with Erbium (Er), to a density in the order of $10^{19}/cm^2$ of Er. The silicon-based materials can be pure Si, silicon oxide, doped silicon oxide, or glasses. This density of Er requires a co-doping of oxide to increase the Er solid solubility in Si. However, in order for the Er radiation centers to generate light, high-energy electrons and holes must be generated and injected into the Er-doped material.

It would be advantageous if an EL device could be fabricated, that would be suitable for low-power, high-density, large-scale IC applications.

It would be advantageous if an EL device could be practically fabricated using conventional Si CMOS processes. It would be advantageous if these EL devices could be operated without large alternating polarity pulses or high-energy electron injections.

SUMMARY OF THE INVENTION

The present invention is a low voltage, low power electroluminescence device that uses Iridium oxide nanotips to generate high fields using a low supply voltages. A silicon-rich silicon oxide (SRSO) with, or without rare earth element doping, is used as phosphor material for the electroluminescence. The Si═O radiation center produces light with wavelengths in the range of 500 nanometers (nm) to 750 nm, with a peak at about 550 nm. An Er-doped material radiation center, for example, produces light at a wavelength of 1.54 micrometers (μm).

Accordingly, a method is provided for fabricating an electroluminescence (EL) device with a nanotip electrode. The method comprises: forming a bottom electrode with nanotips; forming a Si phosphor layer adjacent the nanotips; and, forming a transparent top electrode adjacent the Si phosphor layer, where the Si phosphor layer is interposed between the bottom and top electrodes. The nanotips may have a tip base size of about 50 nanometers, or less, a tip height in the range of 5 to 50 nm, and a nanotip density of greater than 100 nanotips per square micrometer. Typically, the nanotips are formed from iridium oxide (IrOx).

Details of a metalorganic chemical vapor deposition (MOCVD) process are provided for the deposition of the Ir bottom electrode. The IrOx nanotips are grown from the deposited Ir. In one aspect, the Si phosphor layer is SRSO. In response to an SRSO annealing step, nanocrystalline SRSO is formed, with nanocrystals having a size in the range of 1 to 10 nm. In another aspect, the SRSO is doped with a rare earth element such as erbium (Er), ytterbium (Yb), cerium (Ce), praseodymium (Pr), or terbium (Tb). The top electrode can be transparent, made from a material such as indium tin oxide (ITO), Zinc oxyfluoride, or a conductive plastic.

Additional details of the above-described method, and a nanotip electrode EL device are provided below.

DETAILED DESCRIPTION

Figure 1:
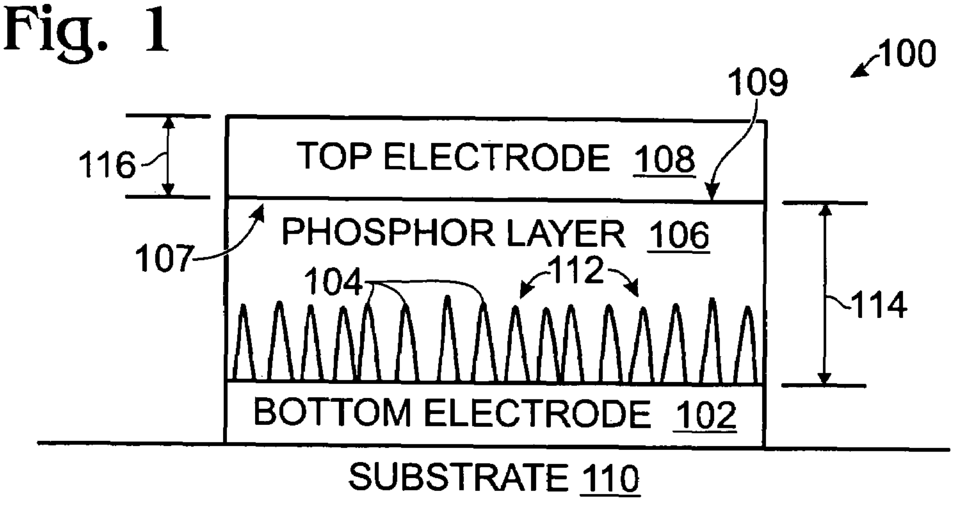
FIG. 1 is a partial cross-sectional view of a nanotip electrode electroluminescence (EL) device.

FIG. 1 is a partial cross-sectional view of a nanotip electrode electroluminescence (EL) device. The EL device 100 comprises a bottom electrode 102 with nanotips 104. A silicon (Si) phosphor layer 106 is adjacent the nanotips 104. A transparent top electrode 108 overlies the Si phosphor layer 106. The Si phosphor layer 106 is interposed between the top electrode 108 and the bottom electrode 102.

As used herein, the word "nanotip" is not intended to be limited to any particular physical characteristics, shapes, or dimensions. The nanotips may alternately be known as nanorods, nanotubes, or nanowires. In some aspects (not shown), the nanotips may form a hollow structure. In other aspects (not shown), the nanotips may be formed with a plurality of tips ends. Although the nanotips 104 are shown substantially vertical, and therefore, perpendicular to the (horizontal) surfaces of the bottom electrode 102, the nanotips are not limited to any particular orientation with respect to the bottom electrode surfaces.

Figure 2:
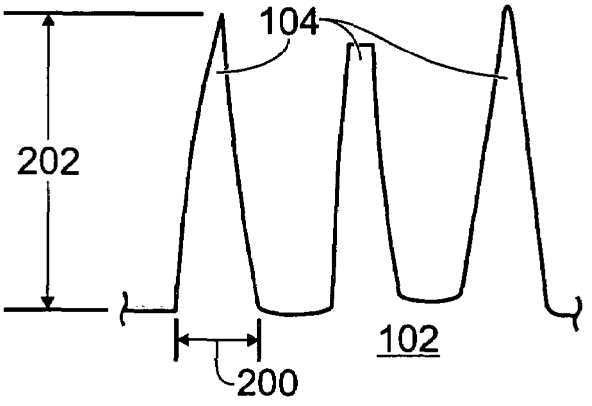
FIG. 2 is a partial cross-sectional view of the EL device of FIG. 1, depicting some nanotips details.

FIG. 2 is a partial cross-sectional view of the EL device of FIG. 1, depicting some nanotips details. The bottom electrode nanotips 104 have a tip base size 200 of about 50 nanometers, or less. The bottom electrode nanotips 104 have a tip height 202 in the range of 5 to 50 nm. Typically, the nanotip density is greater than 100 nanotips per square micrometer. That is, the number of nanotips growing from a 1-square micrometer surface area of the first electrode 102 exceeds typically exceeds 100.

In one aspect, the bottom electrode nanotips 104 are made from iridium oxide (IrOx). The value of "x" may be 2, in which case the Ir is completely oxidized, to values approaching zero, in which case the Ir is not oxidized. Although IrOx nanotips are used to illustrate to illustrate the invention, it is expected that nanotips can also be formed from conductive metal oxides or metals. Alternately stated, the principles behind the nanotip electrode EL device are applicable to other electrode materials that can be formed into a nanostructures.

Returning to FIG. 1, some aspects the EL device 100 further comprise a substrate 110 made from a material such as silicon, silicon oxide, silicon nitride, or a noble metal. The bottom electrode 102 is formed adjacent (overlying) the substrate 110.

Figure 3:
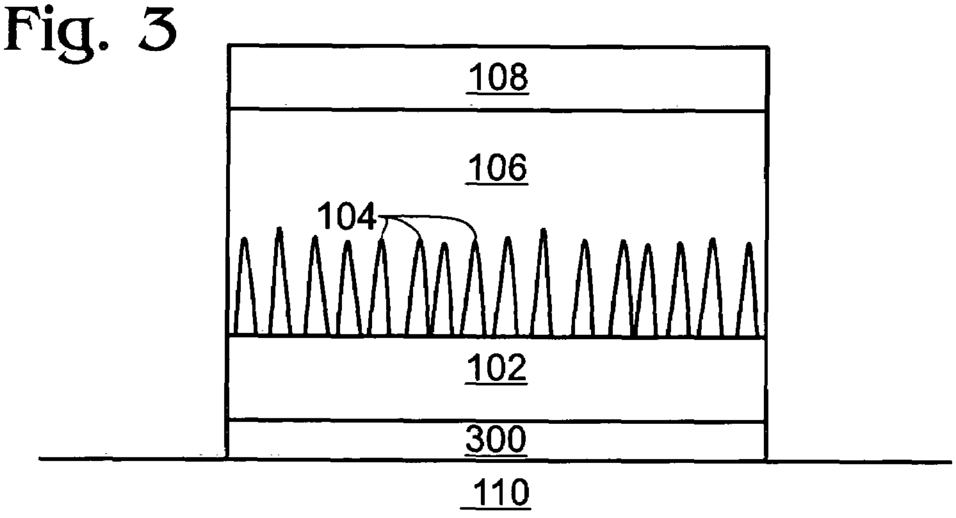
FIG. 3 is a partial cross-sectional view of a first variation of the EL device of FIG. 1.

FIG. 3 is a partial cross-sectional view of a first variation of the EL device of FIG. 1. In some aspects, the EL 100 comprises a substrate 110, with a refractory metal film 300 interposed between the substrate 110 and the bottom electrode 102.

Returning to FIG. 1, in one aspect the Si phosphor layer 106 is a silicon-rich silicon oxide (SRSO) layer. In another aspect, the SRSO layer has a nanocrystalline structure, with nanocrystals having a size (diameter) in the range of 1 to 10 nm. In a different aspect, the SRSO layer is doped with a rare earth element such as erbium (Er), ytterbium (Yb), cerium (Ce), praseodymium (Pr), or terbium (Tb). It should be understood, however, that the nanotip electrode EL device is not limited to any particular Si phosphor crystalline or doping limitations.

As shown, the Si phosphor layer 106 has a planar top surface 107 adjacent a bottom surface 109 of the top electrode 108. That is, the Si phosphor layer top surface 107 is formed as a result of a planarization process, such as a chemical-mechanical polish (CMP). It can also be said that the bottom electrode has a top surface with a nanotip profile. Then, the Si phosphor layer 106 has an irregularly shaped bottom surface that is understood to contoured to match the bottom electrode top surface nanotip profile. The bottom electrode nanotips 104 each have an end 112. As shown, the Si phosphor layer 106 has a thickness 114, between the first electrode nanotip bases (the top surface of the bottom electrode) and the top electrode bottom surface 109, in the range of 20 to 200 nm.

The top electrode 108 may be a material such as indium tin oxide (ITO), Zinc oxyfluoride, or a conductive plastic. However, other materials could also be used. For example, a metal layer, such as gold, can be made thin enough to be transparent. The top electrode 108 has a thickness 116 in the range of 50 to 300 nm.

Figure 4:
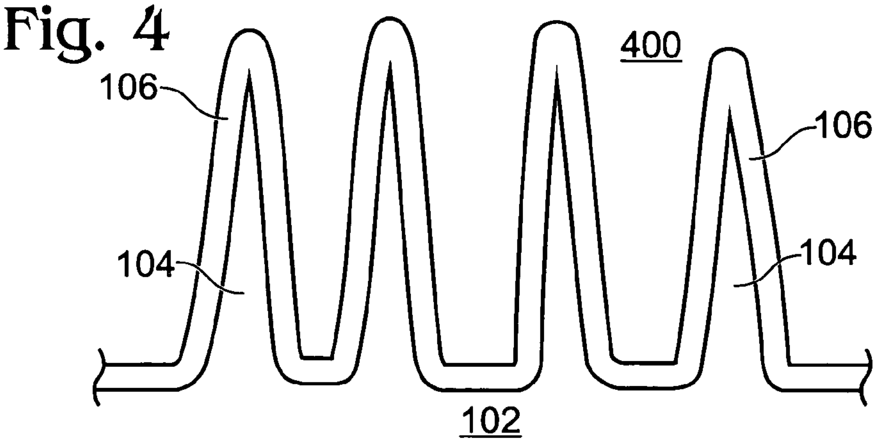
FIG. 4 is a partial cross-sectional view of a second variation of a nanotip electrode EL device.

FIG. 4 is a partial cross-sectional view of a second variation of a nanotip electrode EL device. It might be said that the Si phosphor layer 106 has a bottom surface 400 adjacent to the nanotips in a relationship described as on the nanotips 104, surrounding the nanotips 104, or between the nanotips 104. Although it is possible that being adjacent describes all three of these relationships simultaneously. In this variation, the Si phosphor layer 106 is shown "on" the nanotips 104. Material 400 may be phosphor layer other that Si phosphor layer 106, or a dielectric without phosphor characteristics.

Figure 5:
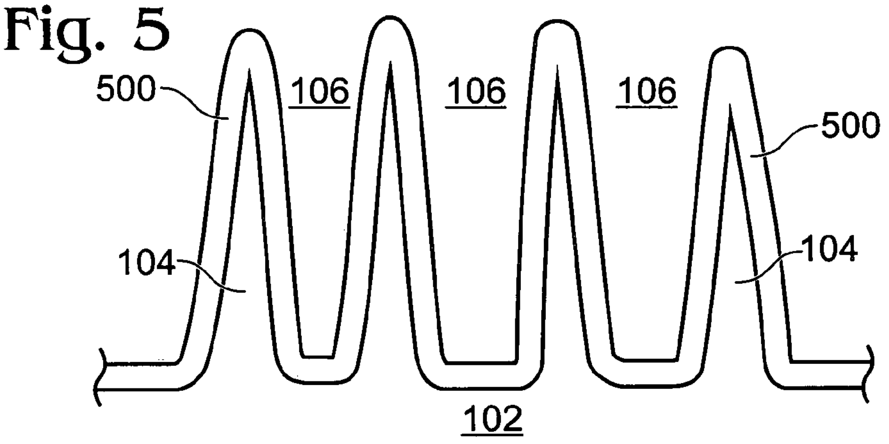
FIG. 5 is a partial cross-sectional view of a third variation of a nanotip electrode EL device.

FIG. 5 is a partial cross-sectional view of a third variation of a nanotip electrode EL device. In this variation, the Si phosphor layer 106 is shown between the nanotips 104. Material 500 may be a phosphor material, different than Si phosphor material 106, or a dielectric without phosphor characteristics. In one aspect, material 500 is crystallized Ir.

Functional Description

Figure 6:
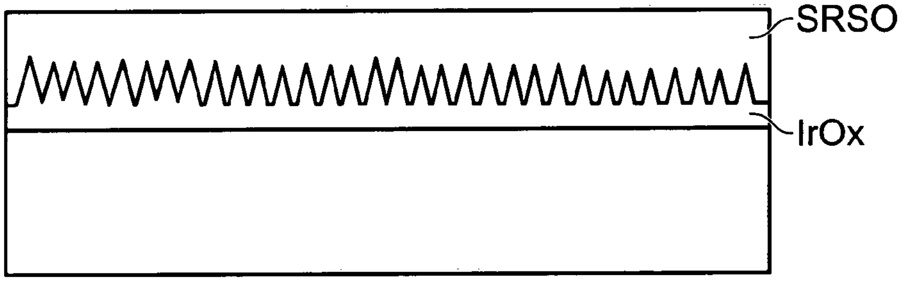
FIGS. 6 and 7 depict steps in the fabrication of the nanotip electrode EL device.
Figure 7:
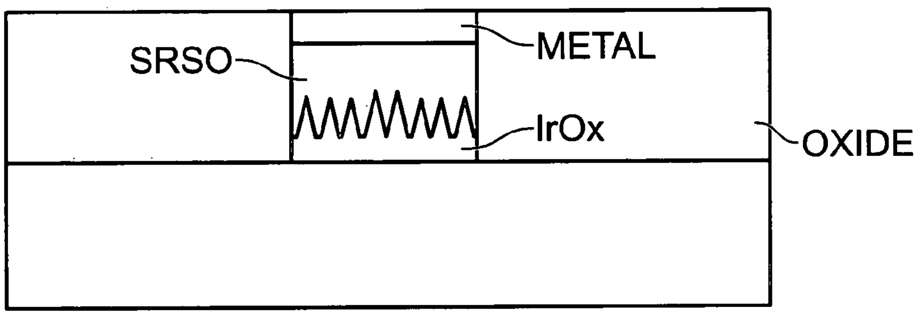

FIGS. 6 and 7 depict steps in the fabrication of the nanotip electrode EL device. As shown, the bottom electrode is made of iridium oxide nanotips. The Si phosphor, for the sake of simplicity, is denoted as SRSO. The top electrode is made from a conductive material such as ITO.

Figure 8:
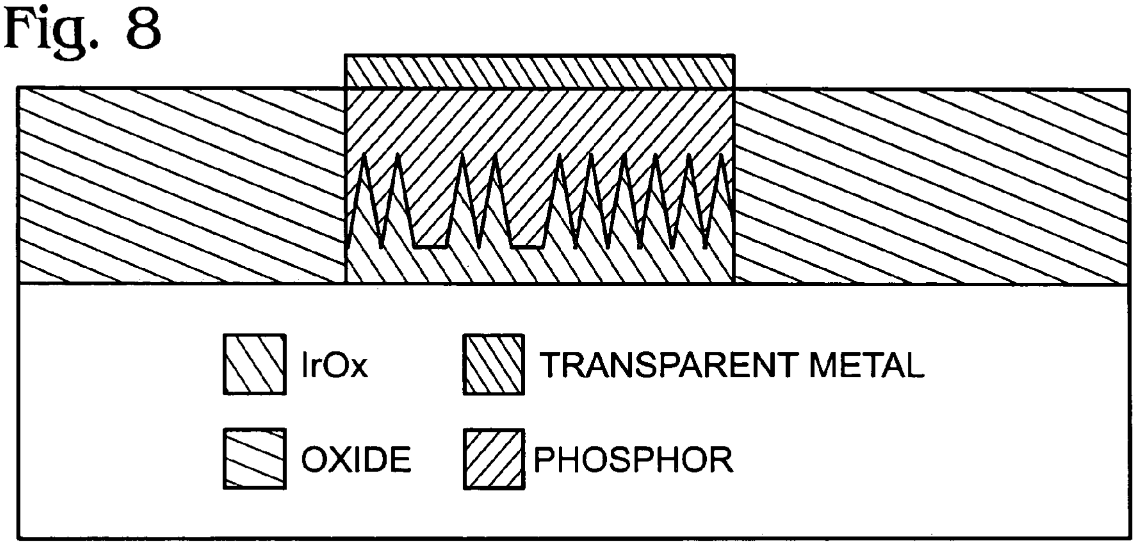
FIG. 8 is a cross-sectional view of the nanotip electrode EL device of FIGS. 6 and 7, after completion.

FIG. 8 is a cross-sectional view of the nanotip electrode EL device of FIGS. 6 and 7, after completion. A nanotip electroluminescence metal-insulator-metal (MIM) diode is shown, where the bottom electrode includes Iridium oxide nanotips. The silicon rich oxide phosphor may be doped with Er for light emission at 1.54 μm.

When a voltage is applied between the transparent electrode and the silicon substrate, a very high field intensity is developed at the end of the IrOx nanotips. High-energy electrons or holes are injected from the IrOx nanotips into the phosphor causing impact ionization at the local crystallites of silicon in the silicon-rich silicon oxide. The activated electrons and holes recombine through the Si═O, or Er dopant radiative centers. The light may also be excited by applying alternating polarity voltage pulses between the transparent electrode and the silicon, or between the top and bottom electrodes. These pulses generate high fields between the IrOx nanotips and the transparent electrode, causing electron and hole flow in the phosphor, leading to light emission as that of a typical MIM device.

One of the methods of growing IrOx nanotips involves the deposition of a thin layer of Ti onto silicon substrate, to enhance the vertical alignment of the IrOx nanotips. The IrOx nanotips is grown by MOCVD, using (Methylcyclopentenyl)(1,5-cyclooctadiene) iridium as a source reagent, at temperature of 350° C., under an oxygen pressure of 10 to 50 torr. The density and the height of the nanotips can be controlled by the sub-layer titanium thickness, the deposition pressure, temperature, and time.

Figure 9:
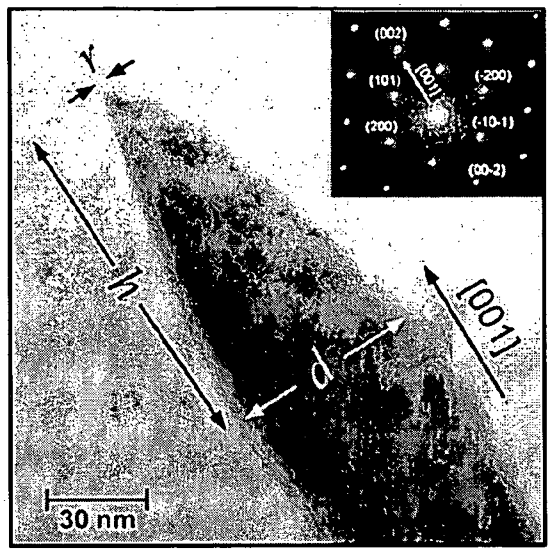
FIG. 9 is a scanning electron microscope (SEM) photo showing a detailed view of a nanotip end.

FIG. 9 is a scanning electron microscope (SEM) photo showing a detailed view of a nanotip end. Since the IrOx nanotips have a pointy end, with a diameter in the order of a few nanometers, a high field intensity may generated at the tip end areas, even if the amplitude of the voltage pulse applied to the electrode, is relatively small. Also, the current is not uniformly distributed. The tip size (diameter) is about 50 nm, which can be controlled by variations in the nanotip growth process. The IrOx tips height is typically from 5 nm to 50 nm, although 100 nm tips heights are also possible. The IrOx nanotips density is typically greater than 100 per square-micrometer, however the density can be greater than 3,000/micrometer$^2$. Uniform device properties can be achieved for device sizes down to the deep sub-micron diameter region.

Figure 10A:
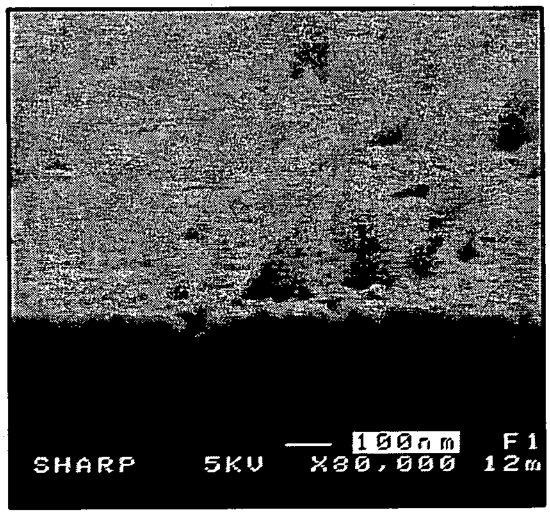
FIG. 10A is a SEM photo of an initial stage of IrOx nanotip grown.

FIG. 10A is a SEM photo of an initial stage of IrOx nanotip grown. Only a few isolated nanotips are visible.

Figure 10B:
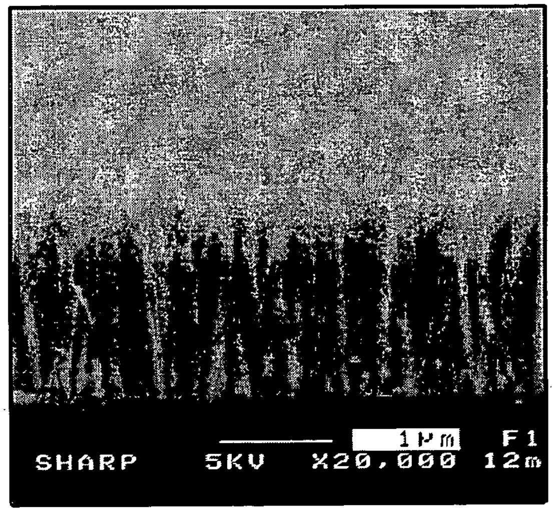
FIG. 10B is a SEM photo of fully-grown IrOx nanotips.

FIG. 10B is a SEM photo of fully-grown IrOx nanotips. A high-density vertical array of nanotips is shown.

After the growth of IrOx nanotips, a thin layer of silicon-rich silicon oxide is deposited onto the top of the nanotips. A CMP process planarizes the deposited oxide. The thickness of the oxide on the top of the nanotips is from 20 nm to 200 nm. A thin layer of ITO, of a thickness from 50 nm to 300 nm, is deposited and patterned to form the top electrode. The IrOx and the silicon rich silicon oxide on the field region may be etched, refilled with silicon oxide, and CMP planarized. The patterned nanotips electroluminescence devices are also suitable for larger area photoemission array formation.

Figure 11A:
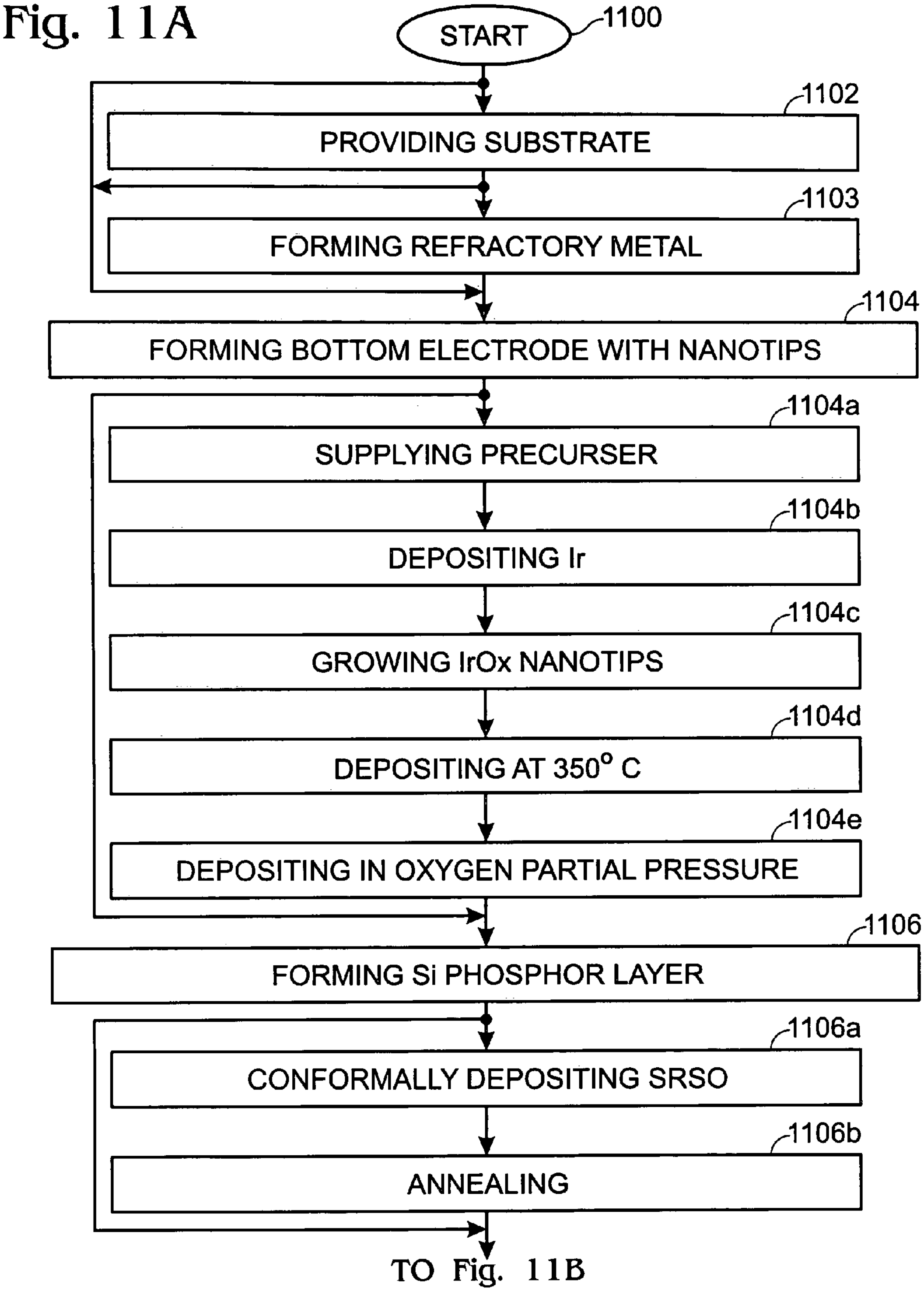
FIGS. 11A and 11B are flowcharts illustrating a method for fabricating an EL device with a nanotip electrode.
Figure 11B:
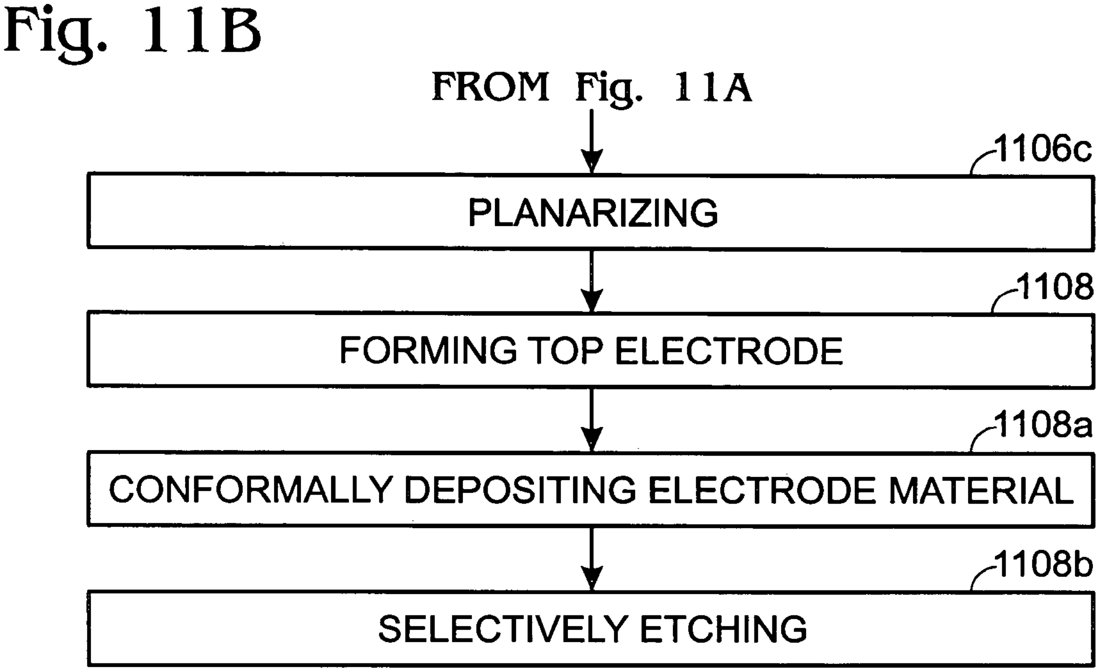

FIGS. 11A and 11B are flowcharts illustrating a method for fabricating an EL device with a nanotip electrode. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. Some details of the method may be better understood in context of the explanations of FIGS. 1-8, above. The method starts at Step 1100.

Step 1104 forms a bottom electrode with nanotips. Step 1106 forms a Si phosphor layer adjacent the nanotips. More explicitly, Step 1106 forms the Si phosphor layer surrounding the nanotips, on the nanotips, and between the nanotips. Step 1108 forms a top electrode adjacent the Si phosphor layer, where the Si phosphor layer is interposed between the bottom and top electrodes.

With respect to Step 1104, the nanotips formed may have a tip base size of about 50 nanometers, or less, a tip height in the range of 5 to 50 nm, and a nanotip density of greater than 100 nanotips per square micrometer. Typically, the nanotips are iridium oxide, although other nanostructure electrode materials may be also be used.

In one aspect, Step 1102 provides a substrate, made from a material such as silicon, silicon oxide, silicon nitride, or a noble metal. Then, forming IrOx nanotips in Step 1104 includes substeps. Step 1104*a*supplies a (Methylcyclopentenyl)(1,5-cyclooctadiene) precursor. Step 1104*b* deposits Ir using a metalorganic chemical vapor deposition (MOCVD) process. Step 1104*c* grows IrOx nanotips from the deposited Ir. Step 1104*d* deposits the Ir at a temperature of about 350° C., and Step 1104*e* deposits the Ir at an oxygen partial pressure in the range of 10 to 50 torr.

In a variation of the method, Step 1103 forms a refractory metal film overlying the substrate. Then, depositing Ir using an MOCVD process in Step 1104*b* includes depositing Ir overlying the refractor metal film.

In one aspect, forming the Si phosphor layer in Step 1106 includes forming a silicon-rich silicon oxide (SRSO) layer. In another aspect, Step 1104 includes forming a bottom electrode with nanotips having nanotip ends, and Step 1106 includes substeps. Step 1106*a* conformally deposits the SRSO overlying the bottom electrode with nanotips. Step 1106*b* anneals the SRSO in ambient content oxygen at a temperature in the range between 700° C. to 1100° C., for a duration in the range between 10 minutes and 90 minutes. Step 1106*c* planarizes the SRSO layer. Then, Step 1108 forms a top electrode overlying the planarized SRSO layer.

In one aspect, Step 1106*a* conformally deposits SRSO, having a thickness in the range of 50 to 500 nm, overlying the nanotips. Step 1106*b* planarizes the SRSO, leaving a thickness of SRSO, in the range of 20 to 200 nm, interposed between the nanotip bases and the top electrode. In another aspect, annealing the SRSO in Step 1106*b* includes forming nanocrystalline SRSO with nanocrystals having a size in the range of 1 to 10 nm. In a different aspect, forming the SRSO layer in Step 1106 includes doping the SRSO with a rare earth element such as Er, Yb, Ce, Pr, or Tb.

In one aspect, forming the top electrode in Step 1108 includes substeps. Step 1108*a* conformally deposits top electrode material having a thickness in the range of 50 to 300 nm. Step 1108*b* selectively etches the top electrode material, SRSO layer, and the bottom electrode. The top electrode can be a material such as ITO, Zinc oxyfluoride, or a conductive plastic.

Figure 12:
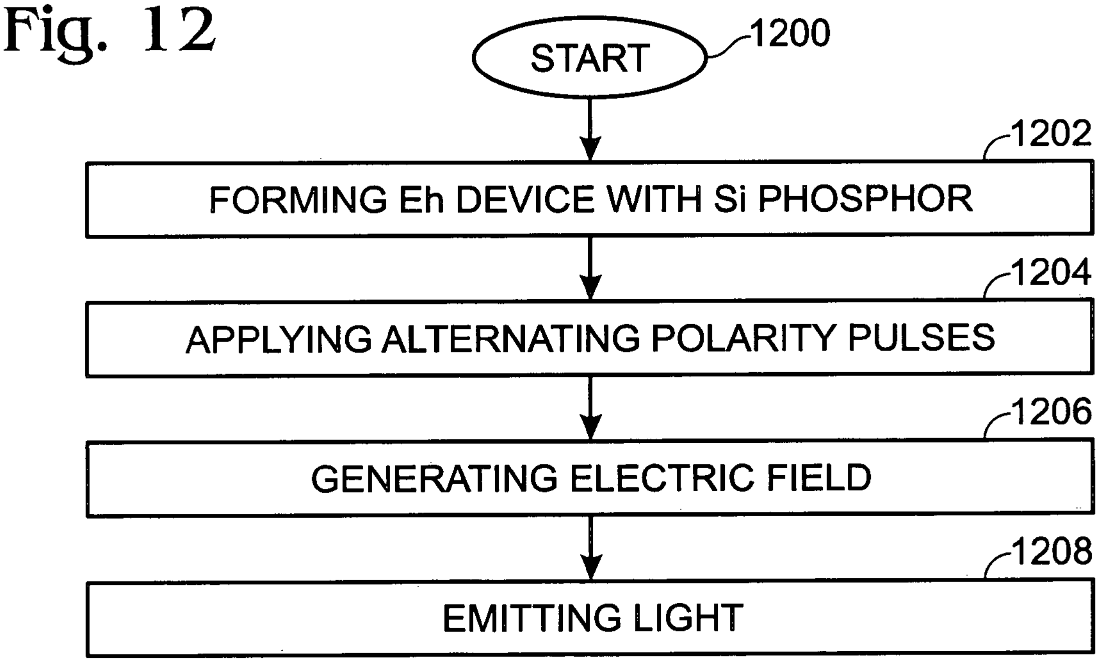
FIG. 12 is a flowchart illustrating a method for generating light from an EL device.

FIG. 12 is a flowchart illustrating a method for generating light from an EL device. The method starts at Step 1200. Step 1202 provides an EL device including a bottom electrode with nanotips, a Si phosphor layer adjacent the nanotips, and a transparent top electrode overlying the Si phosphor layer. Step 1204 applies alternating polarity pulses to the top and bottom electrodes, of less than 10 volts peak-to-peak. Step 1206 generates an electric field in the Si phosphor layer, in vicinity of the nanotips, having an intensity that is greater than $1\times10^6$ volts per centimeter (V/cm).

In one aspect, providing an EL device in Step 1202 includes providing an EL device where the Si phosphor layer is an SRSO material with nanocrystals having a size in the range of 1 to 10 nm. Then, Step 1208 emits light having a wavelength in the range between 500 and 750 nm, in response to the electric field in the SRSO.

In another aspect, Step 1202 provides an EL device where the Si phosphor layer is a SRSO material, doped with a rare earth element. Then, Step 1208 emits light having a wavelength in the range between 0.3 and 1 micrometers, in response to the electric field in the SRSO.

An EL device made with a nanotip electrode, and a corresponding fabrication process has been provided. Specific materials and fabrication details have been given as examples to help illustrate the invention. However, the invention is not limited to merely these examples. Other variations and embodiments of the invention will occur to those skilled in the art.

We claim:

1. A method for fabricating an electroluminescence (EL) device with a nanotip electrode, the method comprising:

forming a bottom electrode with nanotips;

forming a phosphor layer of silicon-rich silicon oxide (SRSO) adjacent the nanotips; and forming a transparent top electrode adjacent the phosphor layer, wherein the phosphor layer is interposed between the bottom and top electrodes.

2. The method of claim 1 wherein forming the bottom electrode with nanotips includes forming nanotips having a tip base size of about 50 nanometers, or less.

3. The method of claim 1 wherein forming the bottom electrode with nanotips includes forming nanotips having a tip height in the range of 5 to 50 nm.

4. The method of claim 1 wherein forming the bottom electrode with nanotips includes forming nanotips having a nanotip density of greater than 100 nanotips per square micrometer.

5. The method of claim 1 wherein forming the bottom electrode with nanotips includes forming iridium oxide (IrOx) nanotips.

6. The method of claim 5 further comprising:

providing a substrate, made from a material selected from the group including silicon, silicon oxide, silicon nitride, and noble metals;

wherein forming IrOx nanotips includes:

supplying a (Methylcyclopentenyl)(1,5 cyclooctadiene) precursor;

depositing Ir using a metalorganic chemical vapor deposition (MOCVD) process; and growing IrOx nanotips from the deposited Ir.

7. The method of claim 6 wherein forming IrOx nanotips further includes:

depositing the Ir at a temperature of about 350° C.; and depositing the Ir at an oxygen partial pressure in the range of 10 to 50 torr.

8. The method of claim 6 further comprising:

forming a refractory metal film overlying the substrate; and wherein depositing Ir using an MOCVD process includes depositing Ir overlying the refractory metal film.

9. The method of claim 1 wherein forming the bottom electrode with nanotips includes forming nanotips, each having a nanotip end and a nanotip base;

wherein forming the phosphor layer adjacent the nanotips includes:

conformally depositing SRSO overlying the bottom electrode with nanotips;

annealing the SRSO in ambient content oxygen at a temperature in the range between 700° C. to 1100° C. for a duration in the range between 10 minutes and 90 minutes; and planarizing the SRSO layer; and wherein forming the top electrode includes forming a top electrode overlying the planarized SRSO layer.

10. The method of claim 9 wherein conformally depositing the SRSO includes conformally depositing SRSO, having a thickness in the range of 50 to 500 nm, overlying the nanotips; and wherein planarizing the SRSO layer includes leaving a thickness of SRSO, in the range of 20 to 200 nm, interposed between the nanotip bases and the top electrode.

11. The method of claim 9 wherein annealing the SRSO includes forming nanocrystalline SRSO with nanocrystale having a size in the range of 1 to 10 nm.

12. The method of claim 9 wherein forming the top electrode includes:

conformally depositing top electrode material having a thickness in the range of 50 to 300 nm; and selectively etching the top electrode material, SRSO layer, and the bottom electrode.

13. The method of claim 1 wherein forming the SRSO layer includes doping the SRSO with a rare earth element selected from the group including erbium (Er), ytterbium (Yb), cerium (Ce), praseodymium (Pr), and terbium (Tb).

14. The method of claim 1 wherein forming the top electrode includes forming a top electrode from a material selected from the group including indium tin oxide (ITO), Zinc oxyfluoride, and conductive plastics.

15. The method of claim 1 wherein forming the phosphor adjacent the nanotips includes forming the phosphor adjacent the nanotips in a relationship selected from a group consisting of surrounding the nanotips, on the nanotips, and between the nanotips.

16. A method for fabricating an electroluminescence (EL) device with a nanotip electrode, the method comprising:

forming a bottom electrode with nanotips, each nanotip having a nanotip end and a nanotip base;

forming a phosphor layer of silicon-rich silicon oxide (SRSO) adjacent the nanotips;

forming a transparent top electrode adjacent the phosphor layer, wherein the phosphor layer is interposed between the bottom and top electrodes;

wherein forming the phosphor layer adjacent the nanotips includes:

conformally depositing SRSO overlying the bottom electrode with nanotips;

annealing the SRSO in ambient content oxygen at a temperature in the range between 700° C. to 1100° C. for a duration in the range between 10 minutes and 90 minutes; and planarizing the SRSO layer; and wherein forming the top electrode includes forming a top electrode overlying the planarized SRSO layer.

* * * * *